(12) United States Patent
Yu et al.

(10) Patent No.: US 8,283,654 B2
(45) Date of Patent: Oct. 9, 2012

(54) NANOWIRE MEMORY

(75) Inventors: Han Young Yu, Daejeon (KR); Byung Hoon Kim, Incheon (KR); Soon Young Oh, Daejeon (KR); Yong Ju Yun, Daejeon (KR); Yark Yeon Kim, Daejeon (KR); Won Gi Hong, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 278 days.

(21) Appl. No.: 12/621,809

(22) Filed: Nov. 19, 2009

(65) Prior Publication Data

US 2010/0314609 A1    Dec. 16, 2010

(30) Foreign Application Priority Data

Jun. 16, 2009    (KR) .................... 10-2009-0053397

(51) Int. Cl.
*H01L 29/06*    (2006.01)
*H01L 35/24*    (2006.01)
*H01L 31/0312*    (2006.01)
*H01L 29/792*    (2006.01)
*H01L 31/0328*    (2006.01)

(52) U.S. Cl. ............... 257/24; 257/40; 257/77; 257/324

(58) Field of Classification Search .................... 257/24, 257/295, 39, 325, 324, 316, 428, 411, 40, 257/368, 77, 401; 977/886, 936, 943
See application file for complete search history.

(56) References Cited

U.S. PATENT DOCUMENTS

| | | | | |
|---|---|---|---|---|
| 5,714,766 A * | 2/1998 | Chen et al. | ...................... | 257/17 |
| 7,662,652 B2 * | 2/2010 | Zhou | .............................. | 438/49 |
| 2005/0139921 A1 * | 6/2005 | Kang et al. | ..................... | 257/347 |
| 2008/0261342 A1 | 10/2008 | Zhou | | |
| 2009/0097320 A1 * | 4/2009 | Min et al. | ................. | 365/185.18 |
| 2009/0134444 A1 * | 5/2009 | Hanafi | ......................... | 257/316 |
| 2010/0032737 A1 | 2/2010 | Seol et al. | | |
| 2010/0276667 A1 | 11/2010 | Kim et al. | | |

FOREIGN PATENT DOCUMENTS

| JP | H11-150261 A | 6/1999 |
|---|---|---|
| JP | 2006-032917 A | 2/2006 |

(Continued)

OTHER PUBLICATIONS

Haroon Ahmed, "Single Electron and Few Electron Memory Cells," Electron Devices Meeting, 1999. IEDM Technical Digest. International, pp. 363-366.

*Primary Examiner* — Chuong A. Luu
(74) *Attorney, Agent, or Firm* — Rabin & Berdo, P.C.

(57) ABSTRACT

Provided is a nanowire memory including a source and a drain corresponding to the source, and a nano channel formed to connect the source to the drain. Here, the nano channel includes a nanowire electrically connecting the source to the drain according to voltages of the source and drain, and a nanodot formed on the nanowire and having a plurality of potentials capturing charges. Thus, the nanowire memory has a simple structure, thereby simplifying a process. It can generate multi current levels by adjusting several energy states using gates, operate as a volatile or non-volatile memory by adjusting the gates and the energy level, and include another gate configured to adjust the energy level, resulting in formation of a hybrid structure of volatile and non-volatile memories.

7 Claims, 5 Drawing Sheets

FOREIGN PATENT DOCUMENTS

| | | |
|---|---|---|
| JP | 2006-228844 A | 8/2006 |
| JP | 2007-273952 A | 10/2007 |
| JP | 2008-004791 A | 1/2008 |
| KR | 0783188 | 11/2007 |
| KR | 2008-0061932 A | 7/2008 |
| KR | 2008-0061996 A | 7/2008 |
| KR | 2008-0062027 A | 7/2008 |
| KR | 2008-0078318 A | 8/2008 |

* cited by examiner

State A   State B

NANOWIRE MEMORY

CROSS-REFERENCE TO RELATED APPLICATION

This application claims priority to and the benefit of Korean Patent Application No. 10-2009-0053397, filed Jun. 6, 2009, the disclosure of which is incorporated herein by reference in its entirety.

BACKGROUND

1. Field of the Invention

The present invention relates to a nanowire memory, and more particularly, to a nanowire memory having a nanowire as a channel and using nanodots adsorbed on the nanowire.

2. Discussion of Related Art

A non-volatile memory including nanodots operates as a memory by applying a negative or positive voltage to a gate electrode to inject or discharge charges into or from the nanodot, and changing a threshold voltage on a source and a drain. Since this memory goes through many complicated processes generally used as semiconductor fabrication processes, which causes high fabrication costs. In addition, a conventional memory has two states, i.e., "1" or "0," so that multi-level data cannot be stored.

SUMMARY OF THE INVENTION

The present invention is directed to a memory device capable of storing multi-level data through a memory including nanodots having a simple structure.

One aspect of the present invention provides a nanowire memory including: a source and a drain corresponding to the source; and a nano channel formed to connect the source to the drain. Here, the nano channel includes a nanowire electrically connecting the source to the drain according to voltages of the source and drain, and a nanodot formed on the nanowire and having a plurality of potentials capturing charges.

The nanowire may be formed of a doped semiconductor.

The nanodot may be formed of a doped semiconductor or a silicide formed by intermixing a semiconductor material with a metal.

The nanowire memory may include at least one nanodot.

The source and the drain may be formed of a silicide including a metal.

The nanowire memory may further include a gate disposed adjacent to the nanodot and configured to adjust a level of potential energy of the nanodot.

The nanowire memory may include the same number of gates as the nanodots.

The nanowire memory may sequentially or non-sequentially adjust the potential energy of the nanodot through the plurality of gates.

The nanowire memory may have a hybrid structure of non-volatile and volatile memories by adjusting respective charge concentrations of the plurality of nanodots.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, the present invention will be described with reference to the accompanying drawings in detail. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Throughout the specification, one part "comprises" a component, which, not illustrated otherwise, does not mean another component is omitted, but another component may be further included.

A nanowire memory according to the present invention will be described with reference to FIGS. 1 to 5 below.

Figure 1:
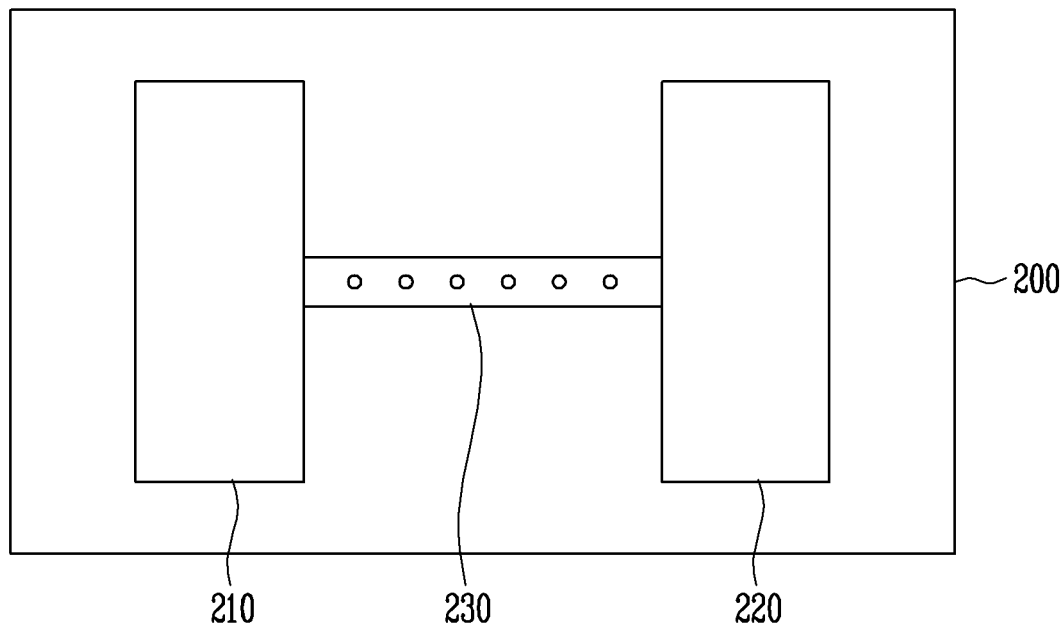
FIG. 1 is a plan view of a nanowire memory according to an exemplary embodiment of the present invention.
Figure 2:
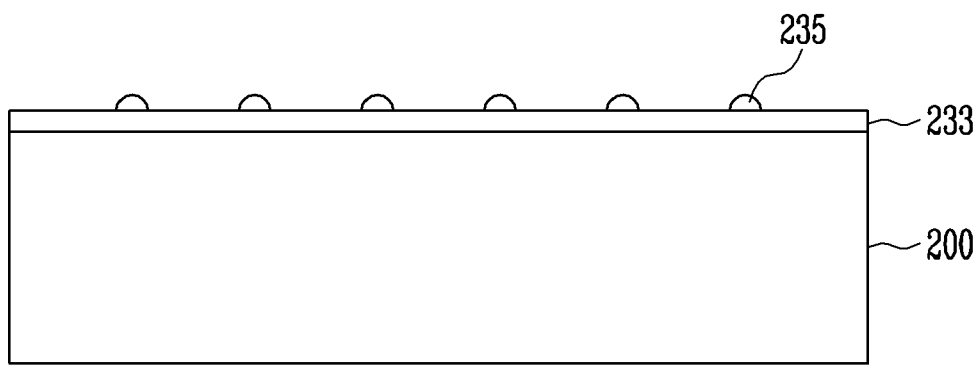
FIG. 2 is an enlarged cross-sectional view of a nanowire channel of FIG. 1.

FIG. 1 is a plan view of a nanowire memory according to an exemplary embodiment of the present invention, and FIG. 2 is an enlarged cross-sectional view of a nanowire channel of FIG. 1.

Referring to FIG. 1, the nanowire memory according to the exemplary embodiment of the present invention includes a source 210, a drain 220 and a nano channel 230 which are disposed on a substrate 200.

That is, the source 210 and the drain 220 are spaced apart from each other on the substrate 200, and the nano channel 230 is formed to connect the source 210 to the drain 220.

As shown in FIG. 2, the nano channel 230 is formed of a nanowire 233 on the substrate 200 which is exposed between the source 210 and the drain 220, and a plurality of nanodots 235 are adsorbed on the nano channel 230 formed of the nanowire 233.

The substrate 200 is formed of silicon, glass or other insulating material, the source 210 and the drain 220 may be formed of metal silicide, doped silicon or a doped semiconductor, the nanowire 233 forming the nano channel 230 may be formed of a doped semiconductor, and the nanodots 235 may be formed by directly adsorbing a doped semiconductor or a metal on the nanowire 233.

The nanowire memory according to the exemplary embodiment of the present invention does not include separate gate and gate insulating layers, so that its fabrication process can be simplified.

Hereinafter, an operation principle of the nanowire memory of FIG. 1 will be explained.

Figure 3:
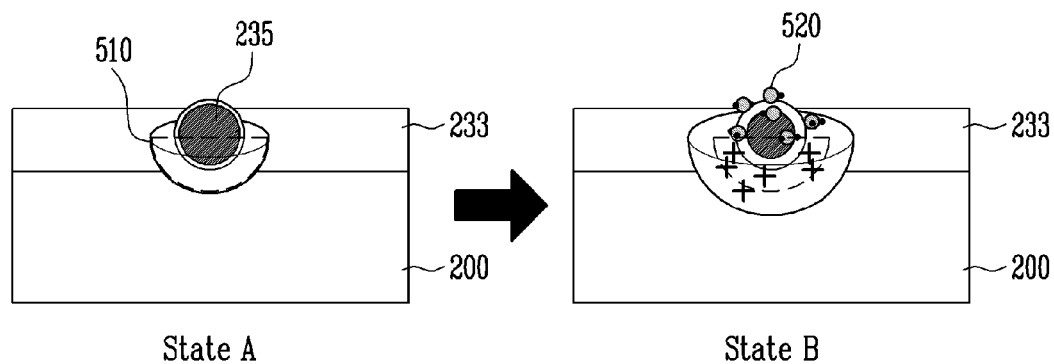
FIG. 3 is a diagram illustrating states of the nanowire memory depending on voltages.
Figure 4:
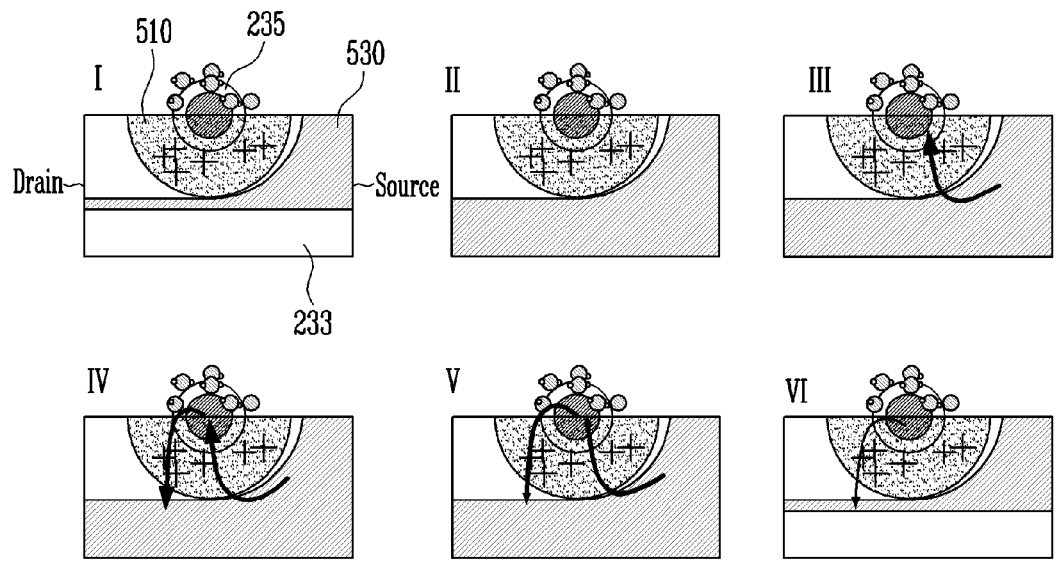
FIG. 4 is a diagram illustrating an operation principle of the nanowire memory of FIG. 1.
Figure 5:
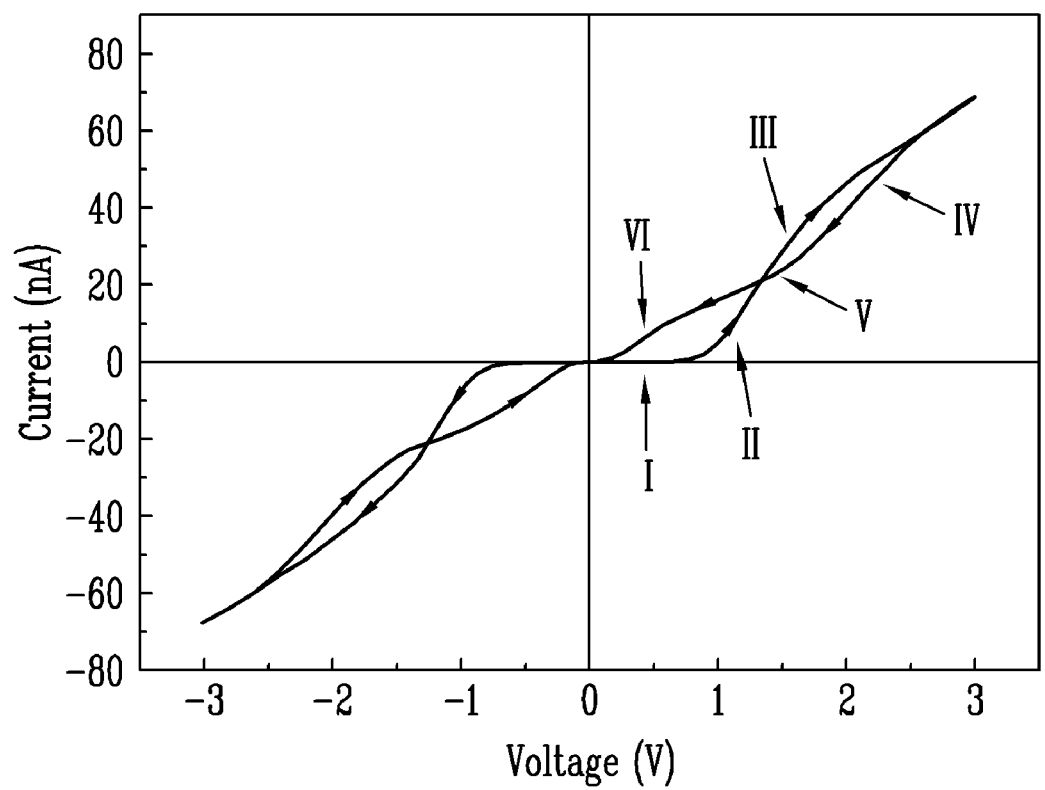
FIG. 5 is a current-voltage curve according to the exemplary embodiment of the present invention.

FIG. 3 is a diagram illustrating states of the nanowire memory according to voltages, FIG. 4 is a diagram illustrating an operation principle of the nanowire memory of FIG. 1, and FIG. 5 is a current-voltage curve according to a first exemplary embodiment of the present invention.

FIG. 3 illustrates an example according to the exemplary embodiment of the present invention, which is a nanowire memory formed by adsorbing a Pb nanodot 235 on a $V_2O_5$ nanowire 233, i.e., a nano channel.

An early state in which the Pd nanodot 235 is adsorbed on the $V_2O_5$ nanowire 233 is referred to as state A.

That is, as the nanodot 235 is adsorbed on the nanowire 233, a nano Schottky barrier is formed between the nanowire 233 and the nanodot 235. A portion shown as a dotted line is a depletion region 510 of the nanowire.

As shown in FIG. 3, charges are distributed in a circle in the nanodot 235. This state expands in area as in state B when water 520 is adsorbed on the nanodot 235 and the nanowire 233. That is, the depletion region 510 of the nanowire 233 and an electron-distribution region of the nanodot 235 expand, respectively.

Due to the increase of the depletion region 510 and formation of defect potential having positive charges in the depletion region 510, the amount of current flowing is changed according to the voltage.

Referring to FIGS. 4 and 5, a nano-Schottky barrier is formed around the nanodot 235 due to the depletion region 510 and induces a very small electron flow 530 at a low source-drain voltage (V=V1), thereby having a low amount of current as in state I.

However, as the voltage is increased, potential becomes higher than a barrier due to depletion, so that the electron flow 530 becomes larger and thus the current value is drastically increased as in state II. When the voltage is gradually increased, state II develops into state III. Here, a potential has a higher energy than the nano-schottky barrier. Thus, the electrons between the source and the drain flow into the nanodot 235 so as to be captured therein.

In state III, when the voltage is decreased, the capture of the electrons continues, and thus the captured electrons are emitted from the nanodot 235, resulting in separation from the electron flow 530.

However, in state IV, an amount of the electrons emitted from the nanodot 235 is smaller than that of the captured electrons due to attraction of the electrons to the positive charges present in the depletion region 510. Thus, the current value in state IV is also lower than that in state III.

However, as the voltage is gradually decreased, the separation of the electrons captured in the nanodot due to the attraction to the positive charges is accelerated, resulting in states V and VI. Here, in state VI, a larger amount of current than that in state I flows at the same voltage.

That is, when the electrons flowing into the nanodot 235 are emitted during distribution of the positive charges in the depletion region 510, hysteresis in which the current generated when the electrons flows outward due to the attraction caused by the positive charges in the depletion region 510 has a different value from that generated when the electrons flow inward is shown.

Likewise, the nanowire memory device according to the exemplary embodiment of the present invention can operate by capturing charges in a nanodot by adjusting a drain voltage instead of the current flow caused by a separate gate insulating layer and gate electrode. In other words, the nanodot is biased only by voltages of the drain and the source.

Another exemplary embodiment of the present invention will be described with reference to FIGS. 6 to 9 below.

Figure 6:
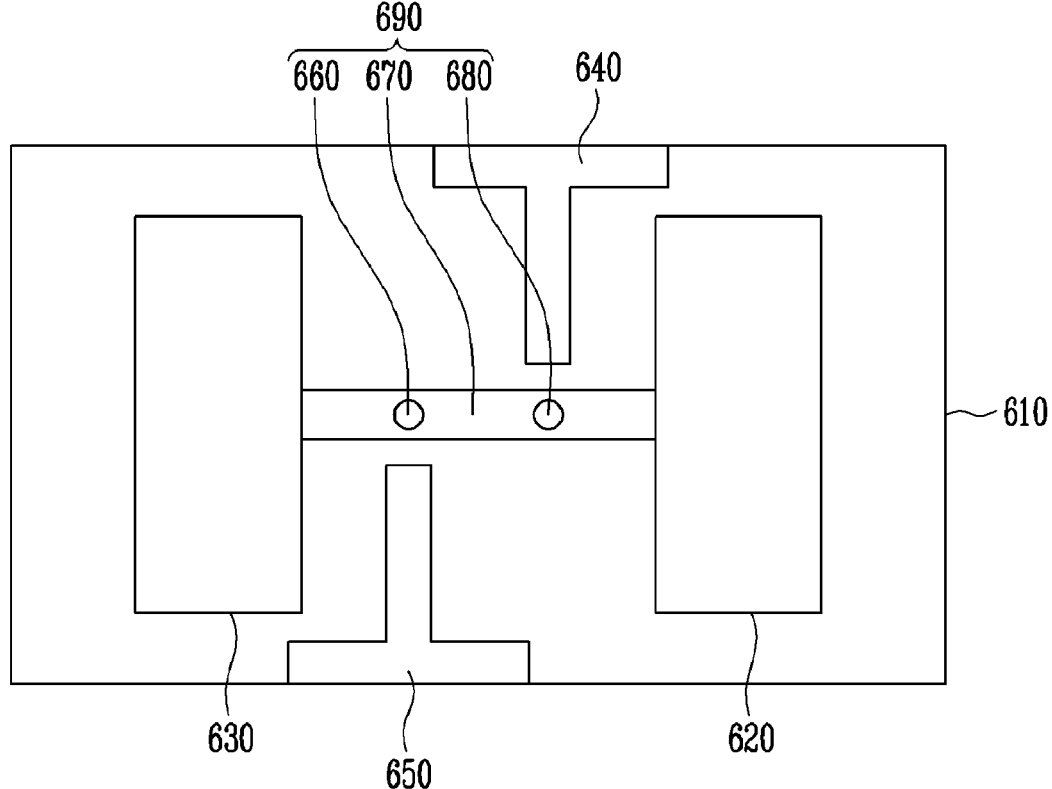
FIG. 6 is a plan view of a nanowire memory according to another exemplary embodiment of the present invention.
Figure 7:
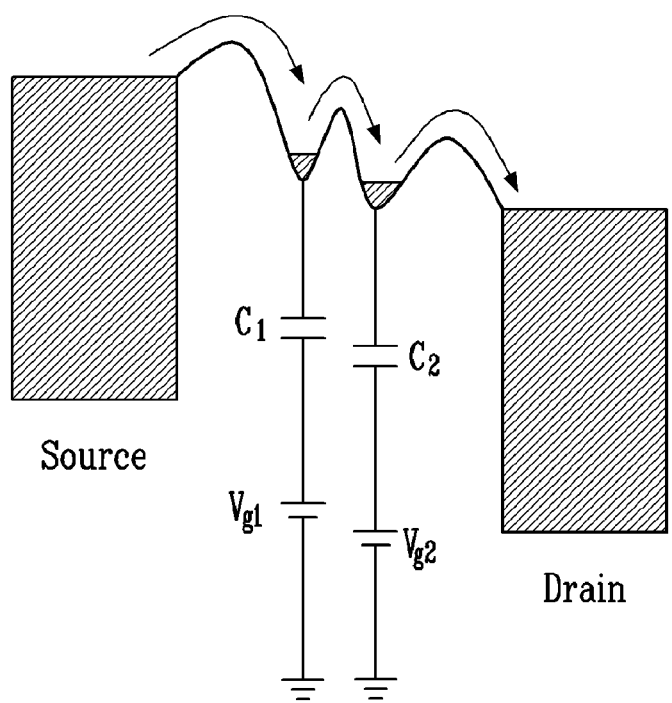
FIGS. 7 to 9 are graphs illustrating an operation principle of the nanowire memory of FIG. 6.
Figure 8:
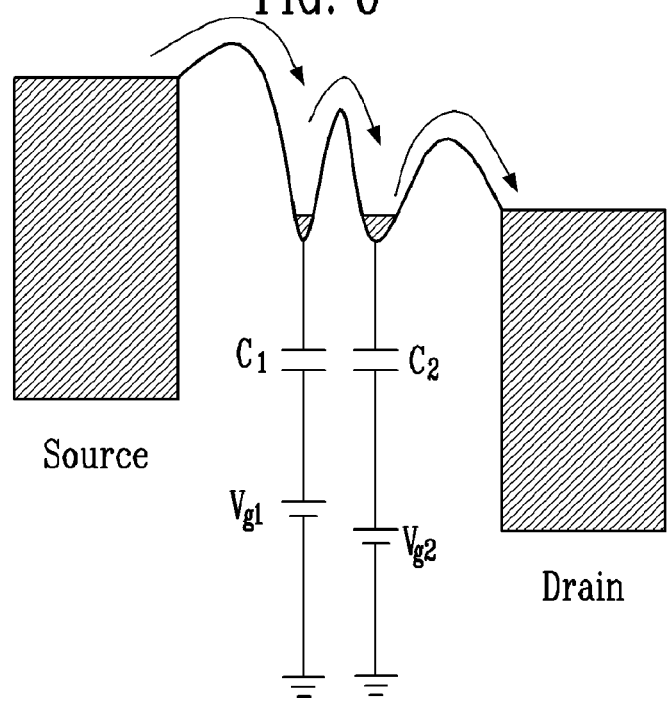
Figure 9:
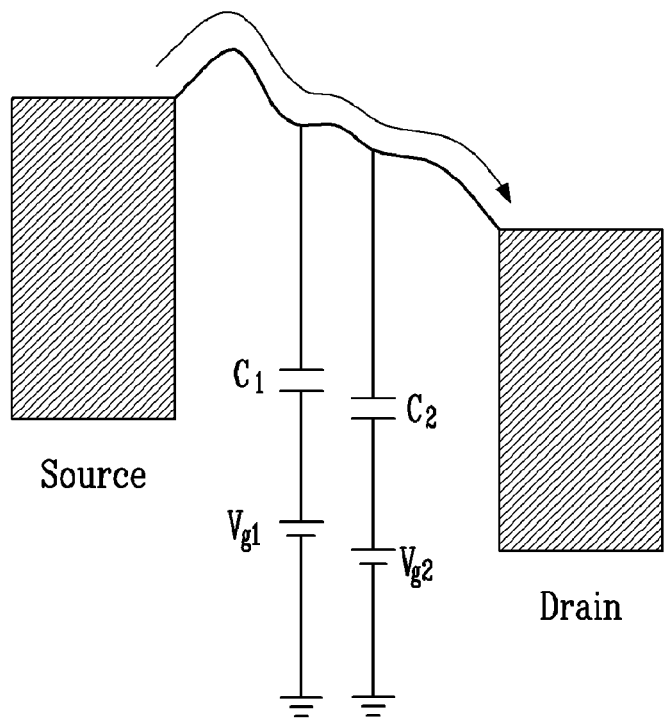

FIG. 6 is a plan view of a nanowire memory according to a second exemplary embodiment, and FIGS. 7 to 9 are graphs illustrating an operation principle of the nanowire memory of FIG. 6.

Referring to FIG. 6, the nanowire memory has a similar structure to that of FIG. 1. That is, a source 630 and a corresponding drain 620 are formed on a substrate 610, and a nano channel 690 is formed between the source 630 and the drain 620.

The nanowire memory according to another exemplary embodiment further includes the same number of gates 640 and 650 as that of the nanodots 660 and 680 on the nano channel 690.

That is, as shown in FIG. 6, two gates 640 and 650 correspond to two nanodots 660 and 680, respectively.

These gates 640 and 650 control potential energies of the corresponding nanodots 660 and 680, respectively, and the detailed operations thereof are shown in FIGS. 7 to 9.

Referring to FIG. 7, defect potential generated when a positive voltage is applied to the drain as shown in the above-mentioned exemplary embodiment is lower than a fermi level of the source, and thus the defect potential is filled with charges.

These charges filling the defect potential flow to the drain in the state shown in FIG. 7 to which a gate voltage is not applied.

Here, in FIGS. 8 and 9, the gate voltage applied to the defect potentials is adjusted. As shown in FIG. 8, when the gate voltage is increased, the defect potential becomes deeper, and thus tunneling of the charges staying in the defect potential to the drain is difficult, resulting in being operated as a non-volatile memory. As shown in FIG. 9, when the gate voltage applied to each defect potential is decreased, the depth of the defect potential is decreased, and the charges are not captured. Thus, the charges are transferred from the source to the drain.

Multi-level signals may be stored by adjusting the amount of the charges in each nanodot using the above-described method. That is, the multi-level signals may be controlled by adjusting several stable current values obtained by adjusting several nanodots and gate voltages.

Thus, unlike the first exemplary embodiment of the present invention relating to the non-volatile nanowire memory, the nanowire memory according to the second exemplary embodiment may adjust volatility using gates.

Further, a hybrid structure of non-volatile and volatile memories may be embodied by adjusting the depth of the defect potential.

That is, the depth of the defect potential is changed by adjusting the size of the nanodot and the concentration of charges. The hybrid structure of the non-volatile and volatile memories may be embodied using the changing depth of the potential.

For example, as shown in FIG. 7, in the nanowire memory adjusting energy using two gates 640 and 650, when both nanodots have different charge concentrations from each other, the nanodot having a lower charge concentration is applicable as a volatile memory, and the nanodot having a higher charge concentration is applicable as a non-volatile memory.

As the charge concentration is increased, a deeper potential well may be formed and the depletion region may have more positive charges. Thus, the nanowire memory may be used as a non-volatile memory. In addition, the nanodot having a lower concentration can be applied as a volatile memory by adjusting the potential depth using the gate electrode.

A non-volatile nanowire memory according to the present invention has a simple structure, thereby simplifying a process, and generates multi-level current level by adjusting several energy states using gates. Further, the non-volatile nanowire memory can be operated as a volatile memory or a non-volatile memory by adjusting the gates and energy level, and a hybrid structure of the volatile memory and the non-volatile memory can be formed by having additional gates configured to adjust the energy level.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A nanowire memory, comprising:
   a source, and a drain corresponding to the source;
   a nano channel including a nanowire electrically connecting the source to the drain according to voltages of the source and the drain, and a plurality of nanodots formed on the nanowire and having a plurality of potentials capturing charges; and
   a plurality of gates disposed adjacent to the nanodots and configured to adjust levels of potential energies of the nanodots, the number of gates being the same as the number of nanodots.

2. The nanowire memory of claim 1, wherein the nanowire is formed of a doped semiconductor.

3. The nanowire memory of claim 2, wherein the nandots are formed of a doped semiconductor or a silicide formed by intermixing a semiconductor material with a metal.

4. The nanowire memory of claim 3, wherein the nano channel includes at least one of the nanodots disposed within the nano channel.

5. The nanowire memory of claim 1, wherein the source and the drain are formed of a silicide including a metal.

6. The nanowire memory of claim 1, wherein potential energies of the nanodots are sequentially or non-sequentially adjusted through the gates.

7. The nanowire memory of claim 6, wherein the nanowire memory has a hybrid structure of non-volatile and volatile memories created by adjusting respective charge concentrations of the nanodots.

* * * * *